(12) United States Patent
Onishi et al.

(10) Patent No.: US 6,590,293 B2
(45) Date of Patent: Jul. 8, 2003

(54) ELECTRONIC COMPONENT, HAVING PROJECTION ELECTRODES AND METHODS FOR MANUFACTURING THEREOF

(75) Inventors: Keiji Onishi, Settsu (JP); Akihiko Namba, Osaka (JP); Katsunori Moritoki, Takatsuki (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/055,609

(22) Filed: Jan. 25, 2002

(65) Prior Publication Data

US 2002/0100964 A1 Aug. 1, 2002

(30) Foreign Application Priority Data

Jan. 26, 2001 (JP) ......................................... 2001-018148

(51) Int. Cl.[7] ..................... H01L 23/48; H01L 23/52; H01L 29/40
(52) U.S. Cl. ................... 257/780; 257/737; 257/738; 257/739; 257/778
(58) Field of Search ................................. 257/780, 737, 257/738, 739, 778

(56) References Cited

U.S. PATENT DOCUMENTS 6,046,071 A * 4/2000 Sawai et al. ................ 438/106
6,433,426 B1 * 8/2002 Ikegami ...................... 257/737

FOREIGN PATENT DOCUMENTS

| JP | 09-237806 | 9/1997 |
| JP | 11-274241 | 10/1999 |

* cited by examiner

Primary Examiner—David Nelms
Assistant Examiner—Tu-Tu Ho
(74) Attorney, Agent, or Firm—Parkhurst & Wendel, L.L.P.

(57) ABSTRACT

An electronic component includes a projection electrode to be bonded to a circuit board. The projection electrode is prevented from being contaminated or oxidized during a period from manufacturing of the electronic component until mounting of the component to the circuit board. Methods of manufacturing the electronic component and an electronic circuit device are also provided. The electronic component includes the projection electrode formed on a connection terminal on a substrate having a circuit element and a protective film for covering the circuit element and the projection electrode. The projection electrode is prevented from being contaminated or oxidized since the manufacturing of the electronic component until mounting thereof to the circuit board, and reliable bonding of the projection electrode to a connection terminal of the circuit board can be realized.

20 Claims, 9 Drawing Sheets

ELECTRONIC COMPONENT, HAVING PROJECTION ELECTRODES AND METHODS FOR MANUFACTURING THEREOF

FIELD OF THE INVENTION

The present invention relates to an electronic component with high reliability, a manufacturing method of the electronic component, and a manufacturing method of an electronic circuit device.

BACKGROUND OF THE INVENTION

Requests for downsizing, lightening and thinning a portable information terminal such as a portable telephone have recently increased, and thus much related technological development has been performed. An electronic component including a semiconductor component must be therefore downsized and lightened, and an electronic circuit device employing it must be also downsized, lightened, and thinned. Since the electronic component is downsized, area of a connection part between an electrode of the electronic component and a connection terminal of a circuit board decreased. Therefore, new technology is required for securing reliability of the connection part.

A chip scale package (CSP) structure has been developed for downsizing and thinning the semiconductor component, and this technology has been applied to not only the semiconductor component but also a high frequency electronic component.

A peculiar structure and a manufacturing method are developed for the semiconductor component having the CSP structure. For example, Japanese Patent Laid-Open No. 9-237806 and Japanese Patent Laid-Open No. 11-274241 disclose a method of manufacturing such semiconductor components, and a method of connecting these semiconductor components to a circuit board. In this manufacturing method, projection electrodes such as solder bumps or gold ball bumps are formed on connection electrodes of semiconductor components, a resin film for wholly covering the projection electrodes is then formed, the resin film is cured, the surface of the resin film is then polished to expose the surfaces of the projection electrodes, and a semiconductor wafer is divided into the individual semiconductor components. These methods allow extreme thinning and downsizing of the semiconductor components comparing with a semiconductor component having the CSP structure formed by a conventional resin mold method.

Additionally, Japanese Patent Laid-Open No. 9-246905 discloses an electronic component including a surface acoustic wave element. The electronic component includes projection electrodes formed on connection electrodes of the surface acoustic wave element and a lid body for covering an active region of the elastic wave element. This publication also discloses a circuit board on which the electronic component is assembled, and a protective resin for covering the lid body.

A conventional electronic component, a method of manufacturing the electronic component, and a method of manufacturing an electronic circuit device employing it will be described hereinafter with reference to FIG. 8A to FIG. 8E and FIG. 9.

FIG. 8A through FIG. 8E are sectional views used for illustrating a conventional manufacturing method of the electronic component such as a semiconductor component and the electronic circuit device.

In FIG. 8A, large number of semiconductor components (not shown) including circuit elements such as transistors and resistors are formed on a semiconductor wafer 30A, and projection electrodes 31 are formed on connection electrodes (not shown) of the semiconductor components. The semiconductor wafer 30A will be subsequently divided into individual semiconductor components along cutting lines 32.

In FIG. 8B, a resin film 33 is formed over the whole surface of the wafer 30A by a spin coat method so as to wholly cover the projection electrodes 31. The surface of the resin film 33 formed on the main surface of the wafer 30A is then polished or ground, thereby exposing the tip surfaces 34 (hereinafter called top parts) of the projection electrodes 31 as shown in FIG. 8C. Then, the wafer 30A is diced along the cutting lines 32, and thus divided into individual semiconductor components 35.

Then, in FIG. 8D, a circuit board 36 having connection terminals 37 and internal wiring 38 is prepared. A vacuum chuck 39 sucks and holds a semiconductor component 35 and positions the projection electrodes 31 onto the connection terminals 37. Ultrasonic wave is supplied to the vacuum chuck 39 to bond the projection electrodes 31 to the connection terminals 37.

In FIG. 8E, a resin film 40 covers and protects at least a peripheral part of the semiconductor component 35. The resin film 40 may wholly cover the semiconductor component 35.

FIG. 9 is a sectional view of an essential part of an electronic circuit device employing an electronic component having a surface acoustic wave element. Internal wiring 42 and connection terminals 43 are formed on a circuit board 41. The electronic component 44 has the surface acoustic wave element (not shown), and a lid body 46 covers an active region of the surface acoustic wave element and thereby forms a vibration space. A resin film 47 covers them.

The electronic component having the surface acoustic wave element is manufactured by the following processes:

Forming many surface acoustic wave elements on a piezoelectric wafer;

Forming a lid body 46 to cover an active region of each surface acoustic wave element and forms a vibration space;

Forming projection electrodes 45 on connection electrodes; and

Dividing the wafer into individual electronic components.

The projection electrodes 45 of each of the electronic components 44 manufactured by this method are positioned onto the connection terminals 43 on the circuit board 41, and then ultrasonic wave is applied to the electronic component to bond the projection electrodes 45 to the connection terminals 43. Then, the resin film 47 covers the peripheral part or the whole of the electronic component 44, thereby forming the electronic circuit device having the surface acoustic wave element.

In a conventional method of manufacturing a semiconductor component, projection electrodes are formed, the surface of a wafer is coated with resin, and the resin is polished or ground to expose the surfaces of the projection electrodes. The resin film formed on the wafer with a diameter as large as 20 cm is hardly polished or ground uniformly, and a number of processes increases.

The semiconductor components must be stored so as to prevent the top parts of the projection electrodes from being contaminated since the wafer is divided into individual semiconductor components with the top parts of the projection electrodes exposed until the semiconductor components are mounted on the circuit boards. The projection electrodes, upon being made of easily-oxidized metal other than gold, have respective surfaces oxidized.

Methods of manufacturing a conventional electronic component having a surface acoustic wave element and a conventional electronic circuit device also have a problem similar to that of the semiconductor component discussed above. In a method of mounting the electronic component on the circuit board and then protecting the peripheral part with resin, a lid body must be carefully handled because strength of the lid body may be not sufficient in the previous processes.

Additionally, the surface acoustic wave element includes an inter-digital transducer (IDT) electrode and a connection electrode that are made of aluminum film on the main surface of a piezoelectric substrate. The aluminum film is exposed in other region than the region covered with the lid body. A gold ball bump as the projection electrode is formed on the connection electrode made of the aluminum film. Coolant is poured onto the wafer in a dicing process, but the coolant may cause corrosion of the electrode or penetration of water into the lid body.

When $LiTaO_3$ or $LiNbO_3$ is used as a piezoelectric wafer, powder generated during dicing may alkalinize the coolant, which may corrode the aluminum film. When the gold ball bump is formed on the connection electrode made of the aluminum film, electrochemical corrosion may occur on the interface between them.

SUMMARY OF THE INVENTION

An electronic component has not only a top part of a projection electrode but also the main surface mechanically and environmentally protected. A method of manufacturing the electronic component and a method of manufacturing an electronic circuit device employing the electronic component are provided.

The electronic component includes a substrate, a circuit element disposed on the substrate, a connection electrode connected to the circuit element disposed on the substrate, a projection electrode formed on the connection electrode, and a protective film for covering the circuit element, the substrate, and the projection electrode.

DESCRIPTION OF THE PREFERRED EMBODIMENTS (Exemplary Embodiment 1)

Figure 1:
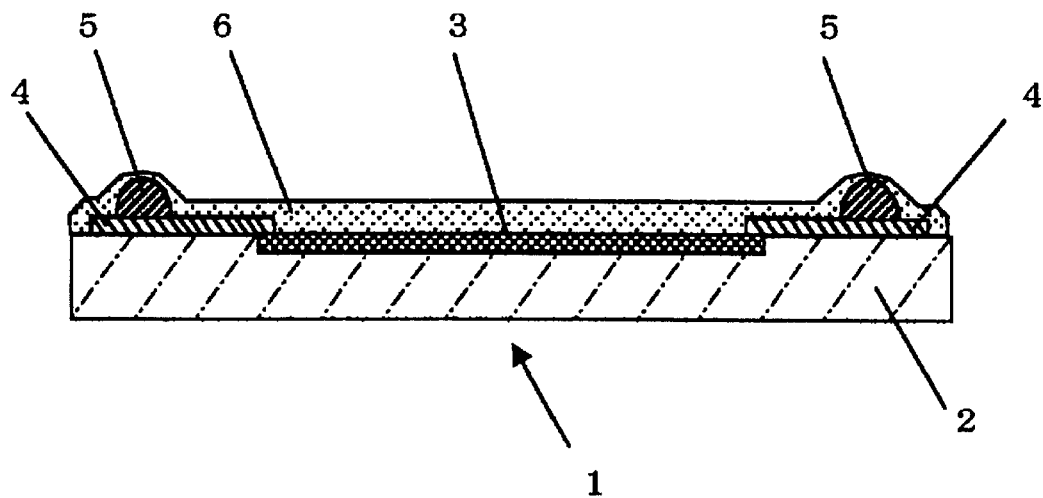
FIG. 1 is a sectional view of an essential part of a semiconductor component in accordance with exemplary embodiment 1 of the present invention.

FIG. 1 is a sectional view of an essential part of a semiconductor component in accordance with exemplary embodiment 1 of the present invention. A semiconductor component 1 of the embodiment includes a semiconductor device 3 structured with a transistor, a resistant element, and internal wiring that are formed on a semiconductor substrate 2. Projection electrodes 5 are formed on connection electrodes 4. A resin film 6 as a protective film covers the semiconductor substrate 2, the semiconductor device 3, and the projection electrodes 5.

The semiconductor component 1 is manufactured in the following processes. In a semiconductor manufacturing process, first, many semiconductor devices 3 are formed on a semiconductor wafer. The projection electrodes 5 are then formed on the connection electrodes 4 of the semiconductor devices 3. The projection electrodes 5 are made of gold, aluminum, aluminum alloy, copper, or the like. The resin film 6 is then formed on the entire surface of the semiconductor wafer by the spin coat method or the like. The semiconductor wafer is then divided into semiconductor components 1.

The entire surface of each of such semiconductor components 1 is covered with the resin film 6. Therefore, even when the projection electrodes are made of easily oxidized metal other than gold, surfaces of the projection electrodes 5 are prevented from being contaminated or oxidized until the semiconductor component 1 is mounted on a circuit board.

For mounting the semiconductor component 1 having a main surface as well as the projection electrodes 5 covered with the resin film 6 onto the circuit board, the projection electrodes 5 is bonded to the circuit board. At this time, the resin film 6 on the tops of the projection electrodes 5 are crushed just before the bonding, or the resin film 6 on the tops is crushed by pressing the tops onto connection terminals on the circuit board during the bonding.

When the protective film is made of oxide, nitride, or nitrogen oxide, the protective film can protect the projection electrodes more perfectly.

The protective film, upon being made of thermoset resin, thermoplastic resin, or ultraviolet curing resin, can be easily spread with a simple apparatus.

The protective film on the tops of the projection electrodes is thinner than that in other region. The protective film can sufficiently protect the electronic component, and can reduce deformation of the projection electrodes required for mounting the electronic component on the circuit board. For bonding the projection electrodes having the protective film on their top parts to the circuit board, the protective film must be crushed by the deformation of the projection electrodes to directly contact the projection electrodes with the connection terminals. This phenomenon is realized by the deformation of the projection electrodes.

(Exemplary Embodiment 2)

Figure 2:
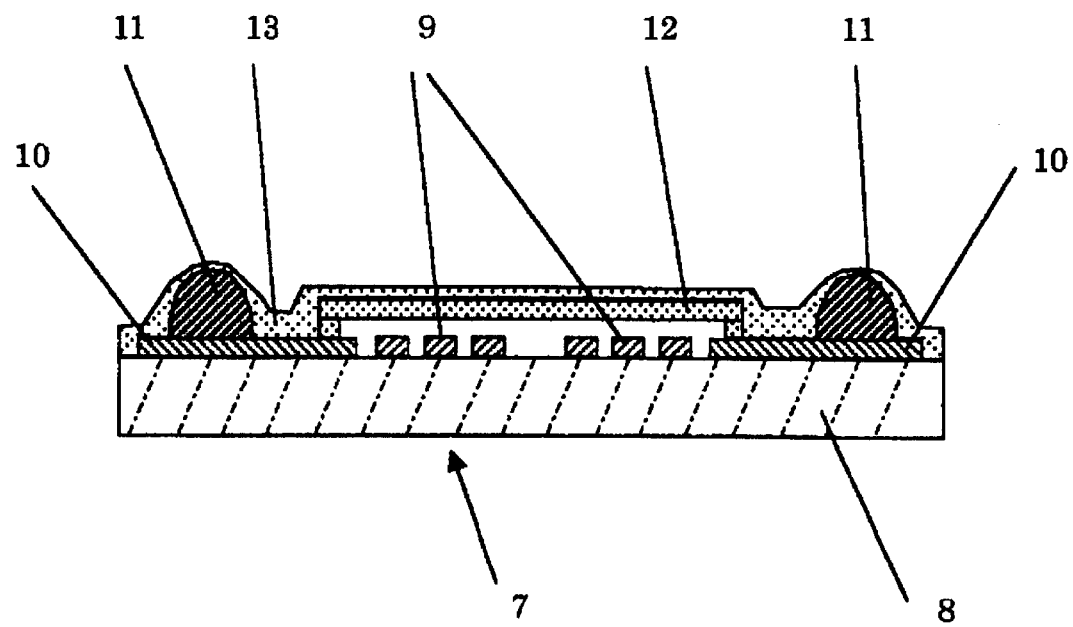
FIG. 2 is a sectional view of an essential part of an electronic component such as a surface acoustic wave element in accordance with exemplary embodiment 2 of the present invention.

FIG. 2 is a sectional view of an essential part of an electronic component such as a surface acoustic wave element in accordance with exemplary embodiment 2 of the present invention.

As shown in FIG. 2, the electronic component 7 having a surface acoustic wave element includes the following elements:

The surface acoustic wave element that is formed on the surface of a piezoelectric substrate 8 and has inter-digital transducer (IDT) electrodes 9; connection electrodes 10 guided out of the IDT electrodes 9;

A hollow lid body 12 that covers an active region of the surface acoustic wave element and a vibration space;

Projection electrodes 11 formed on the connection electrodes 10; and

A resin film 13 for further covering the top parts of the projection electrodes 11 and the upper part of the hollow lid body 12.

Since surfaces of the projection electrodes 11 are covered with the resin film 13 similarly to the semiconductor component described in the embodiment 1, the surfaces thereof are prevented from being contaminated or oxidized until the electronic component 7 is mounted on a circuit board.

A conventional lid body is generally formed with photosensitive dry film resist (hereinafter called film resist). The conventional lid body, however, does not have high entire mechanical strength or adhesion strength of a joint part between it and the piezoelectric substrate, so that the lid body of electronic component must be handled carefully. While, in the electronic component in the embodiment 2, its whole surface is protected by the resin film 13 to improve mechanical strength, and the joint part between the lid body 12 and the piezoelectric substrate 8 is wholly protected from water corroding the IDT electrodes 9.

For mounting the electronic component 7 having a main surface as well as the projection electrodes 11 covered with the resin film 13 onto the circuit board, as discussed in the embodiment 1, the projection electrodes 11 is bonded to the circuit board. At this time, the resin film 13 on the tops of the projection electrodes 11 are crushed just before the bonding, or the resin film 13 on the tops is crushed by pressing the tops onto connection terminals on the circuit board during the bonding.

The protective film, upon being made of thermoset resin, thermoplastic resin, or ultraviolet curing resin, can be easily spread with a simple apparatus, and especially the joint part between the lid body and the piezoelectric substrate can be protected mechanically and from water penetration.

(Exemplary Embodiment 3)

Exemplary embodiment 3 relates to a method of manufacturing the electronic component having the surface acoustic wave element in the exemplary embodiment 2. FIG. 3A through FIG. 3F are sectional views for illustrating the manufacturing method.

Figure 3A:
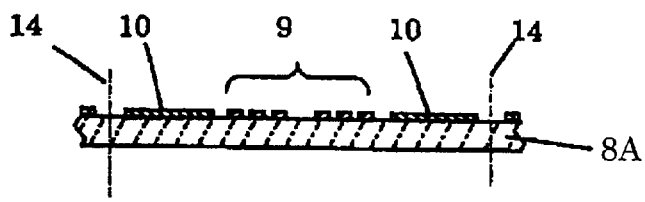
FIG. 3A through FIG. 3F are sectional views for illustrating a method of manufacturing an electronic component in accordance with exemplary embodiment 3 of the present invention.

In FIG. 3A, many surface acoustic wave elements including IDT electrodes 9 and connection electrodes 10 are formed on a piezoelectric wafer 8A. The wafer 8A will be subsequently divided into individual electronic components 7 along cutting lines 14.

Figure 3B:
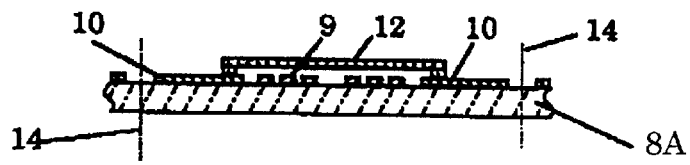

Then, in FIG. 3B, a hollow lid body 12 for covering an active region of each surface acoustic wave element is formed. A film resist is first adhered to the whole surface of the wafer 8A having the surface acoustic wave element, and exposed and developed to form the sidewall part of the lid body 12. A film resist is then adhered to the whole surface of the wafer 8A, and exposed and developed to form the ceiling part of the lid body 12. Thereby, the lid body 12 is formed.

Figure 3C:
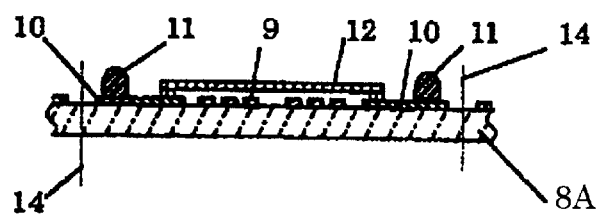

In FIG. 3C, a projection electrode 11 is formed on each connection electrode 10. A gold wire having a gold ball at its tip is prepared similarly to the wire bonding method employing a gold wire, then the gold ball is pressed onto the surface of the connection electrode 10 by an ultrasonic thermocompression bonding method to form the projection electrode. Then, the gold wire is cut at the tip of the projection electrode.

Figure 3D:
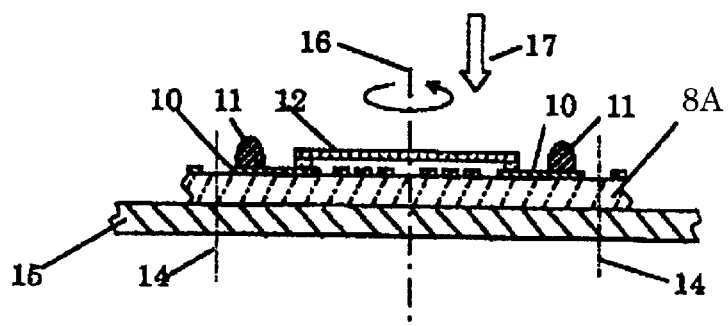
Figure 3E:
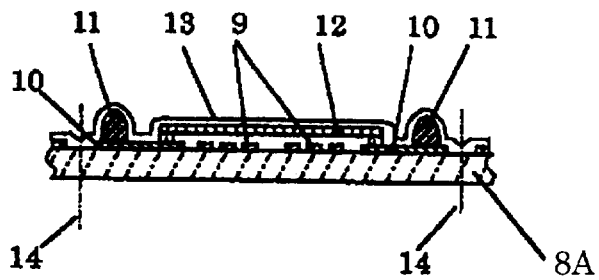

In FIG. 3D, the piezoelectric wafer 8A is disposed on a rotating table 15 of a rotation coating apparatus, and liquid resin 17 is dropped and then spread by rotating the rotating table 15 with a rotating shaft 16. Thereby, a resin film 13 is formed as shown in FIG. 3E.

Figure 3F:
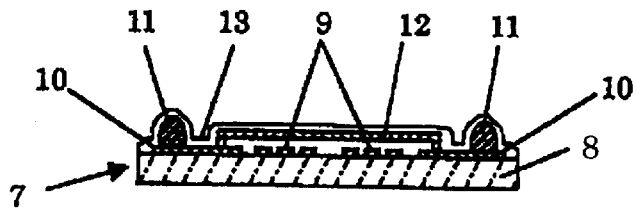

Finally, the wafer 8A is cut along the cutting lines 14, and thus electronic components 7 shown in FIG. 3F are obtained of which whole surfaces including the top parts of the projection electrodes 11 are covered with the resin film 13.

(Exemplary Embodiment 4)

Figure 4A:
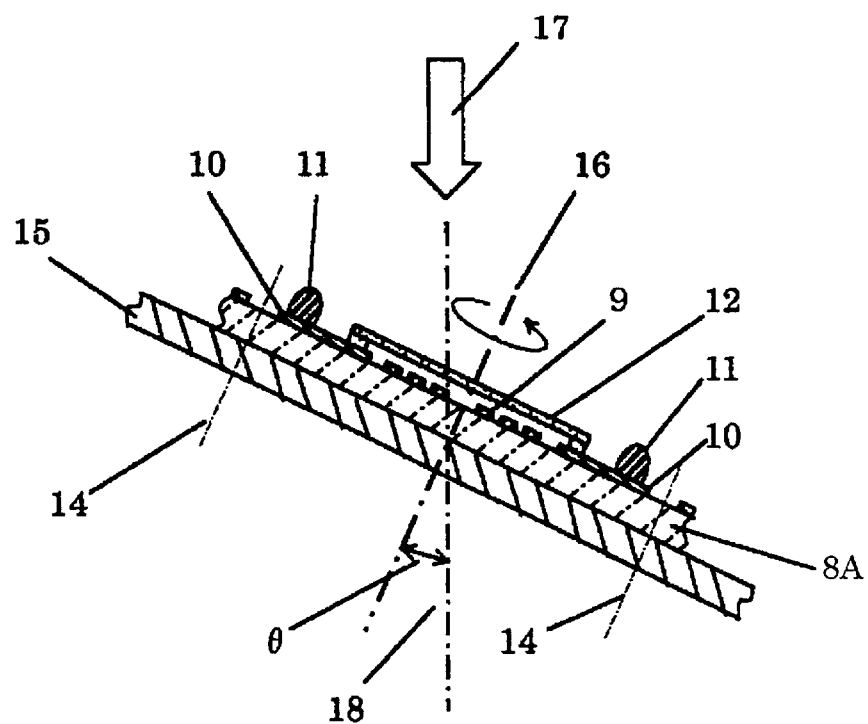
FIG. 4A and FIG. 4B are sectional views for illustrating a method of manufacturing an electronic component in accordance with exemplary embodiment 4 of the present invention.
Figure 4B:
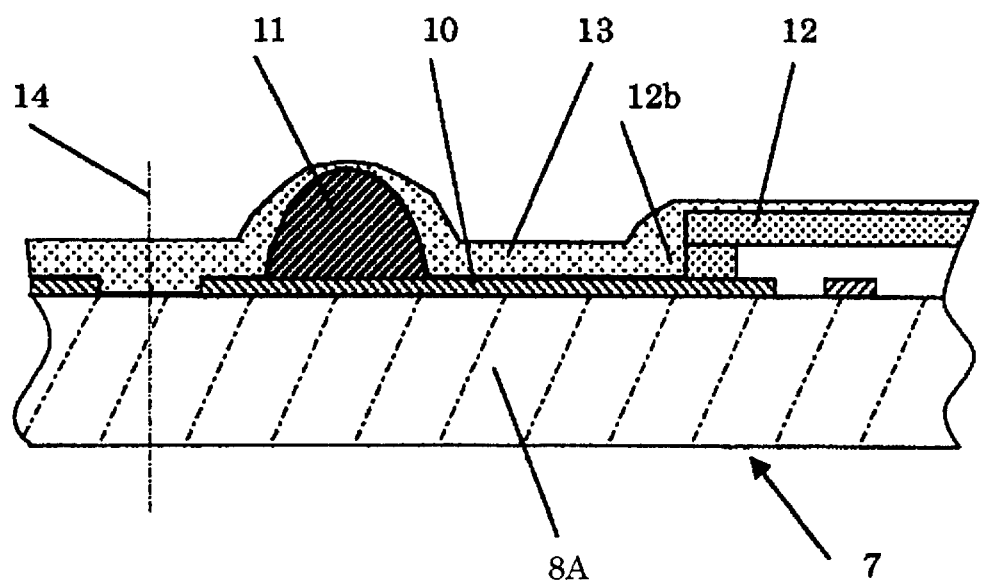

FIG. 4A and FIG. 4B are sectional views for illustrating a method of manufacturing an electronic component in accordance with the exemplary embodiment 4 of the present invention.

In exemplary embodiment 4, as shown in FIG. 4A, a rotating shaft 16 can be inclined from a vertical axis 18 by any angle in a rotation coating process (see FIG. 3D). The inclination angle of the rotating shaft 16 with respect to the vertical axis 18 is experimentally determined in consideration of viscosity and specific gravity of the resin and height of the lid body.

FIG. 4B is a sectional view of an essential part of the electronic component coated with the resin film 13 by the method shown in FIG. 4A. The rotating shaft 16 is inclined to sufficiently fill and coat the joint part 12b between the piezoelectric wafer 8A and the lid body 12 with the liquid resin 17. The resin improves mechanical strength of the lid body 12 and adhesion strength of the lid body 12 to the piezoelectric wafer 8A, and also prevents water from penetrating through the joint part. In this process, the liquid resin 17 is firstly dropped while the rotating shaft 16 is fitted to the vertical axis 18, and then the rotating shaft 16 is inclined or simultaneously inclined and rotated. The sidewall part of the lid body 12 can be thus easily filled with the liquid resin 17.

A temperature of the piezoelectric wafer 8A is set to be not higher than a curing temperature of the liquid resin 17 by heating or the like before and after the dropping of the resin onto the piezoelectric wafer 8A. Thereby, the joint part 12b between the lid body 12 and the piezoelectric wafer 8A can be further easily filled with the liquid resin 17. Bubbles contained in the liquid resin 17 and the joint part can be easily removed.

Ultrasonic wave is applied after the dropping of the liquid resin 17 to the piezoelectric wafer 8A. The bubbles contained in the liquid resin 17 and the joint part 12b can be also easily removed.

When the piezoelectric wafer 8A is heated before and after the dropping of the liquid resin 17 and the ultrasonic wave is applied after the dropping of the liquid resin 17, the bubbles contained in the liquid resin 17 and the joint part 12b can be further removed.

A vessel surrounding at least a rotating table 15 of the rotation coating apparatus is previously set decompressible.

The liquid resin 17 is dropped and then the vessel is decompressed to degas the inside of the liquid resin 17, thereby preventing bubbles from remaining in the liquid resin 17 and the joint part 12b.

(Exemplary Embodiment 5)

Figure 5A:
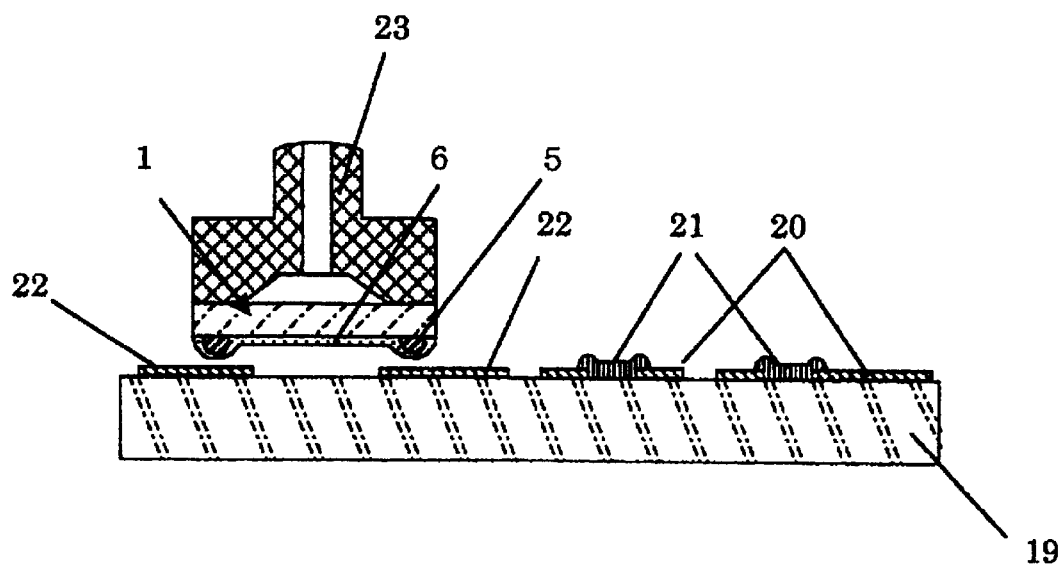
FIG. 5A and FIG. 5B are sectional views for illustrating a method of manufacturing an electronic circuit device in accordance with exemplary embodiment 5 of the present invention.
Figure 5B:
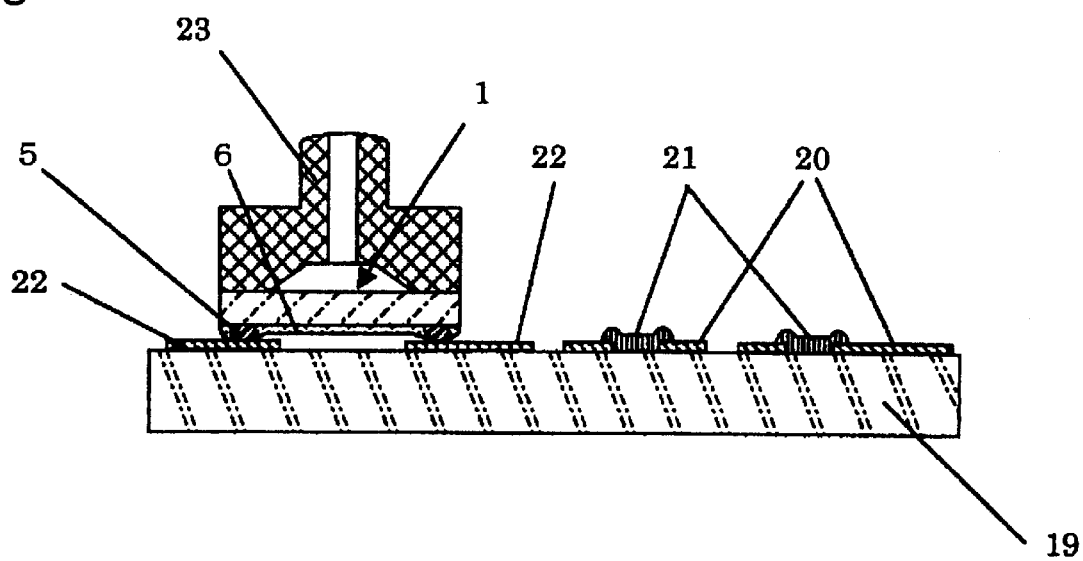

FIG. 5A and FIG. 5B are sectional views for illustrating a method of manufacturing an electronic circuit device in accordance with exemplary embodiment 5 of the present invention. In exemplary embodiment 5, a semiconductor component is illustrated and description of a connection electrode and the like is omitted.

In FIG. 5A, internal wiring 20, circuit components 21, and connection terminals 22 are formed on a circuit board 19. A vacuum chuck 23 sucks and holds the semiconductor component 1, and projection electrodes 5 are positioned onto the connection terminals 22. In this state, the main surface of the semiconductor component 1 as well as the top parts of the projection electrodes 5 are covered with a resin film 6.

Then, in FIG. 5B, the projection electrodes 5 are pressed onto the connection terminals 22 to deform top parts of the projection electrodes 5 to crush the resin film 6. The projection electrodes 5 thus directly contact with the connection terminals 22, and they can be bonded with each other by ultrasonic wave.

The semiconductor component is mounted to the circuit board 19 in a remaining state of the resin film 6 on the projection electrodes 5 in the exemplary embodiment 5. This eliminates the need for a process of polishing the resin film 6 in a state of the wafer to expose the top parts of the projection electrodes 5 in the conventional manufacturing method of a chip scale package (CSP).

Figure 6A:
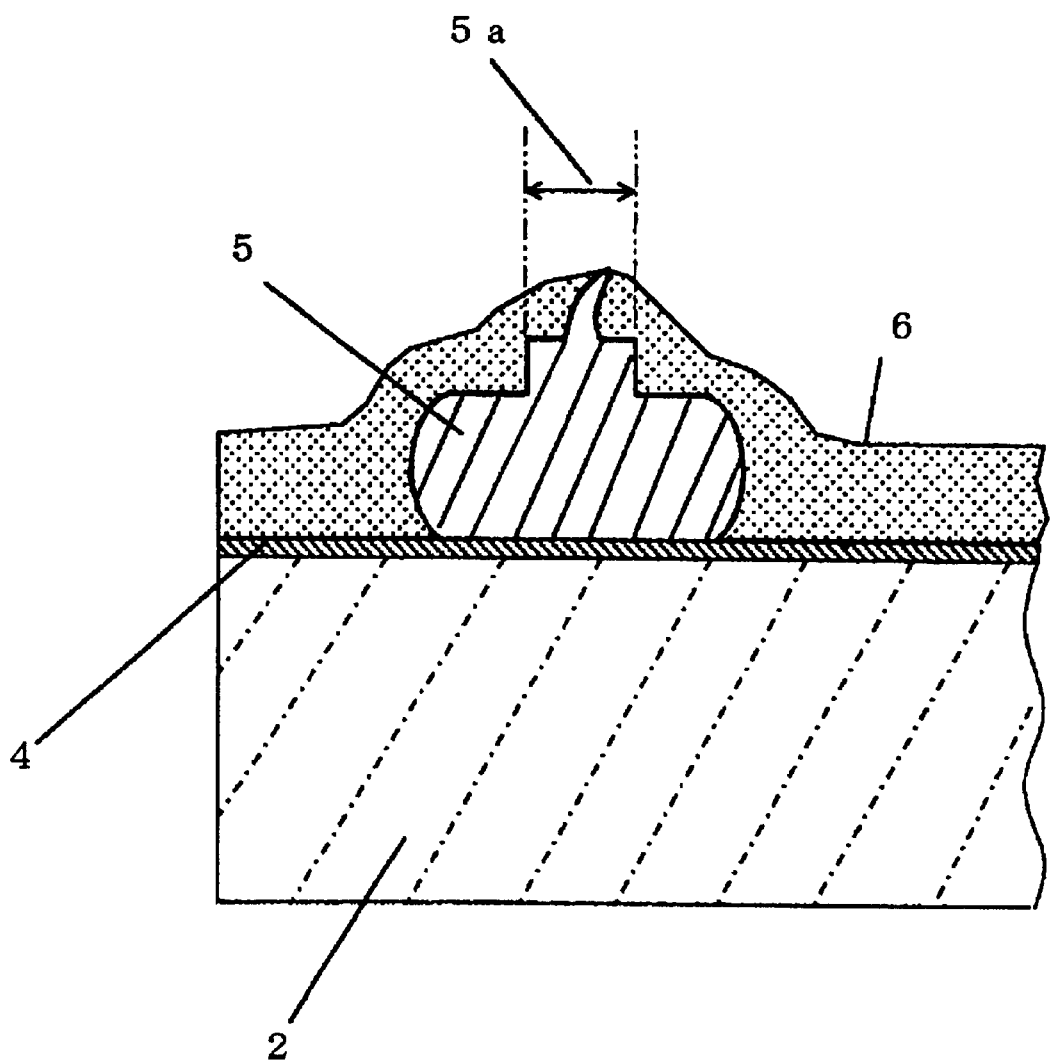
FIG. 6A and FIG. 6B are sectional views of an essential part of a projection electrode formed in the electronic component in accordance with exemplary embodiment 5 of the present invention.

The projection electrodes 5 preferably have a cross section shape shown in FIG. 6A. The projection electrodes 5 having such a shape can be easily formed through ultrasonic thermo-compression bonding of gold balls at the tips of recently-well-employed gold wires. In this case, projection parts 5a sufficiently more slender than the maximum diameter of the projection electrodes 5 are formed. When the projection electrodes 5 are pressed onto the connection terminals 22 on the circuit board 19 shown in FIG. 5, the projection parts 5a deform to extremely easily crush the resin film 6 on the tops. The projection electrodes 5 therefore directly contact with the connection terminals 22 to provide a good bonding. The projection parts 5a can easily have a required shape by previously machining, into a predetermined shape, the tip of a tool used for bonding the gold balls onto the connection terminals.

The projection electrodes 5 are bonded to the connection terminals 22 during applying of ultrasonic wave and heat, and this thus provides a stronger bonding.

The ultrasonic wave may be applied, after the projection electrodes 5 are pressed onto the connection terminals 22 and the resin film 6 on the tops of the projection electrodes 5 are sufficiently crushed.

When a ceramic board or a metal board having an insulation layer on at least its surface is employed as the circuit board 19, ultrasonic wave is applied also from the circuit board 19 side to easily realize further stronger bonding. Ultrasonic energy concentrates on the interfaces between the projection electrodes 5 and the connection terminals 22 from both sides in this case, so that higher energy can be concentrated on the interfaces compared with the case of the ultrasonic wave applied only from the semiconductor component 1 side. Ultrasonic wave with high energy applied from the semiconductor component 1 side causes a problem such as sliding between the vacuum chuck 23 and the semiconductor component 1. However, to decrease the ultrasonic energy applied from the semiconductor component 1 side and to increase the ultrasonic energy applied from the circuit board 19 side make high ultrasonic energy finally concentrate on the interfaces.

Figure 6B:
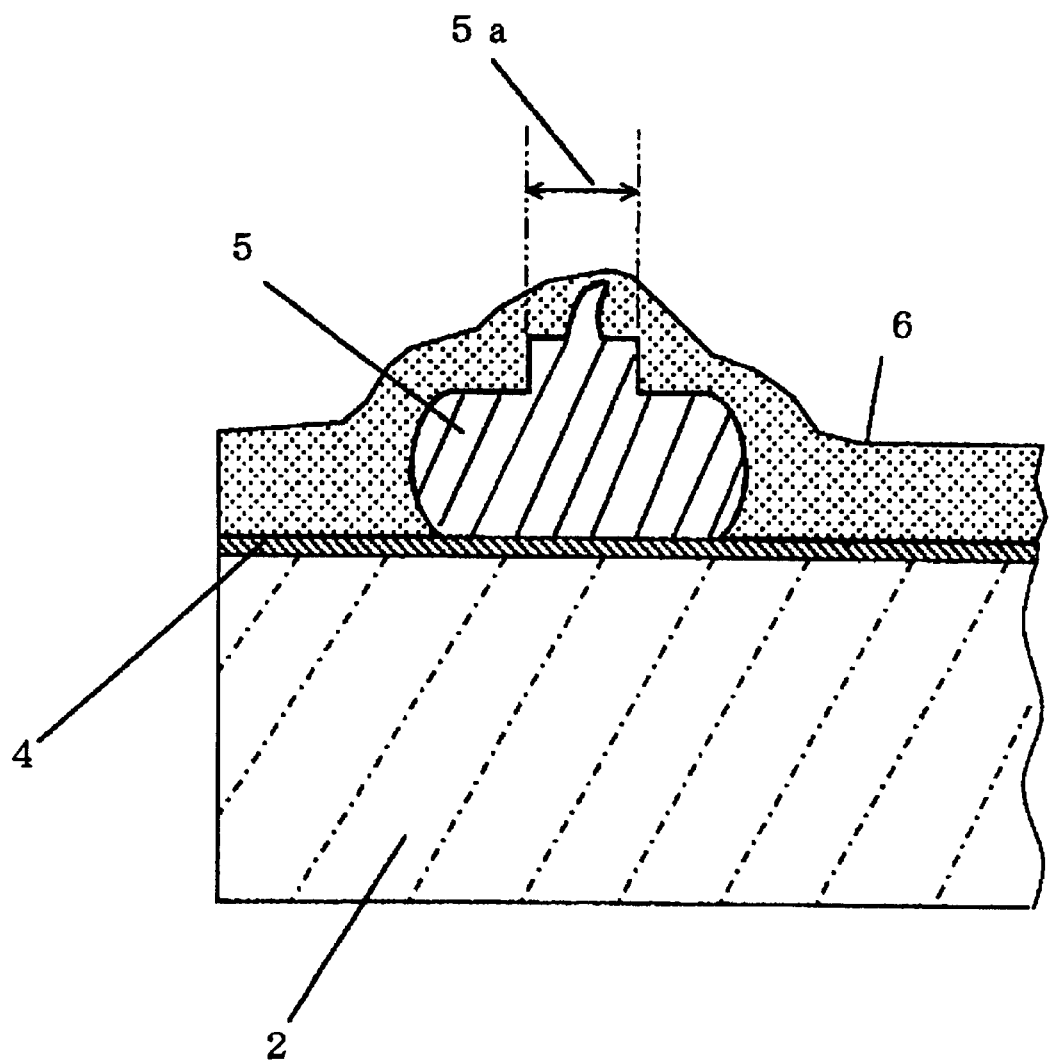

The tips of the projecting parts are exposed from the protective film in FIG. 6A, however, the projecting parts may be covered with the protective film 6 as shown in FIG. 6B.

The semiconductor component has been illustrated in embodiment 5, however, this embodiment can be also applied to an electronic component having a lid body for covering a surface acoustic wave element, and thereby a similar advantage is produced.

(Exemplary Embodiment 6)

Figure 7A:
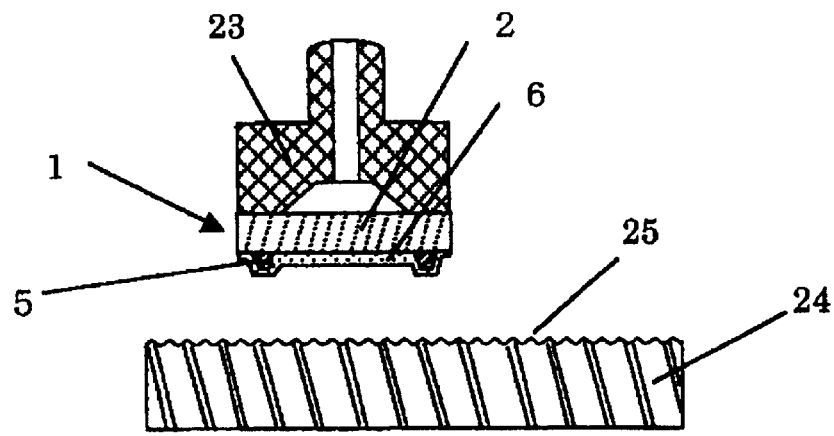
FIG. 7A through FIG. 7C are sectional views for illustrating a method of manufacturing an electronic circuit device in accordance with exemplary embodiment 6 of the present invention.
Figure 7B:
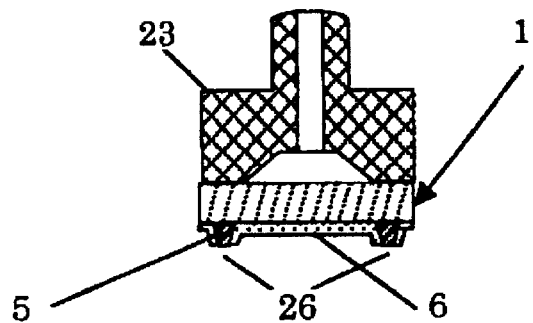
Figure 7C:
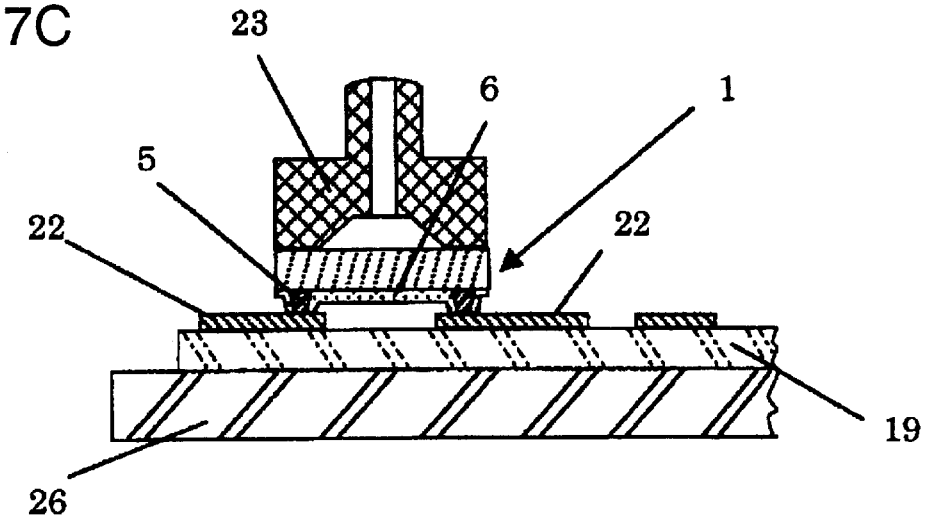
Figure 8A:
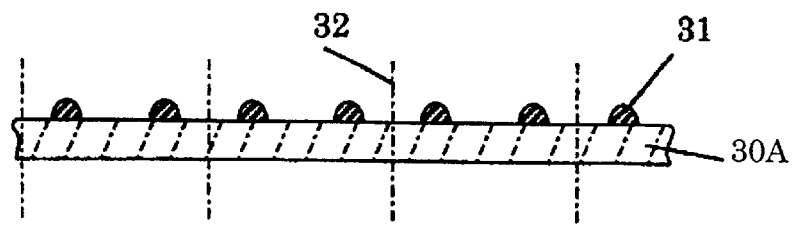
FIG. 8A through FIG. 8E are sectional views for illustrating a method of manufacturing a conventional electronic component such as a semiconductor component and a conventional electronic circuit device.
Figure 8B:
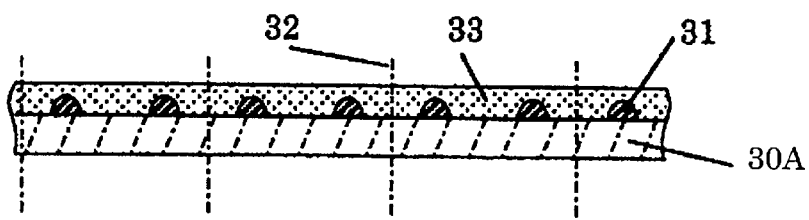
Figure 8C:
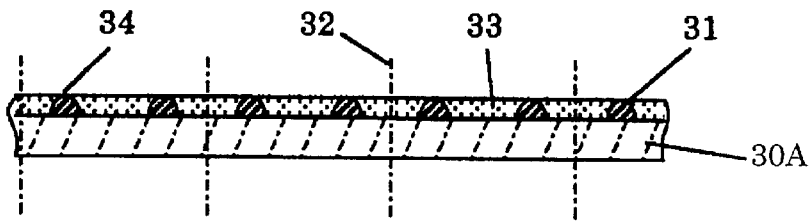
Figure 8D:
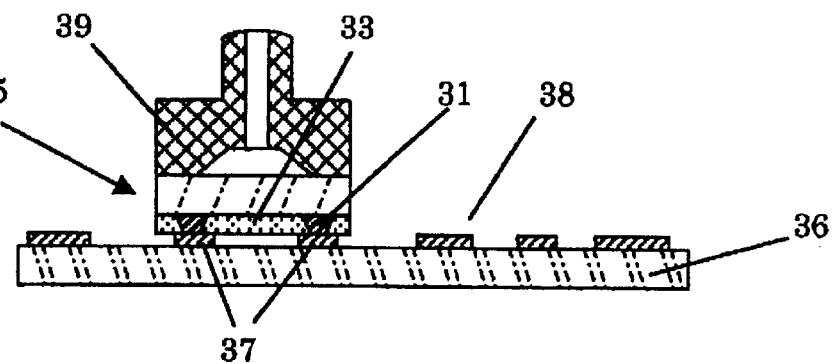
Figure 8E:
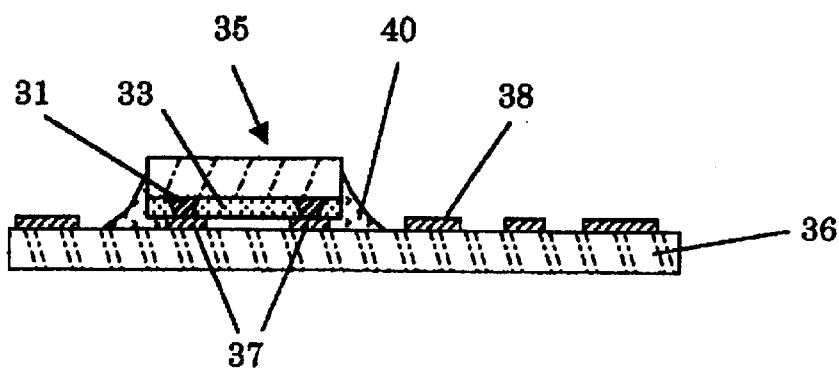
Figure 9:
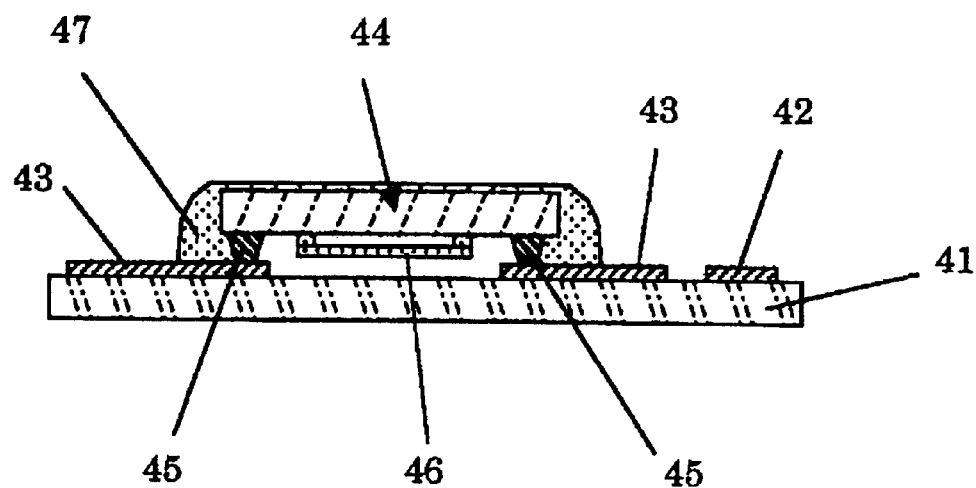
FIG. 9 is a sectional view of an essential part of a conventional electronic circuit device employing an electronic component having a surface acoustic wave element.

FIG. 7A through FIG. 7C are sectional views for illustrating a method of manufacturing an electronic circuit device in accordance with exemplary embodiment 6 of the present invention. In exemplary embodiment 6, a resin film 6 on the tops of a projection electrodes 5 is crushed on a prepared polishing block 24 before the projection electrodes 5 is bonded to the connection terminals 22.

In FIG. 7A, a vacuum chuck 23 sucks a semiconductor component 1 having the resin film 6 on its whole surface including the projection electrodes 5 and presses the component onto a rough polishing surface 25 of the polishing block 24. Then, the vacuum chuck 23 moves horizontally, or the polishing block 24 moves horizontally or rotates. At this time, load applied to the semiconductor component 1 or roughness of the rough polishing surface 25 is adjusted for removing the resin film 6 on the tops of the projection electrodes 5 without breaking the projection electrodes 5.

The resin film 6 on the tops of the projection electrodes 5 are removed, and exposed surfaces are formed as shown in FIG. 7B. Then, as shown in FIG. 7C, the projection electrodes 5 are positioned onto the connection terminals 22 on the circuit board 19 disposed on a board fixing table 26, and the projection electrodes 5 are bonded to the connection terminals 22 with ultrasonic wave applied to them.

When the resin film 6 on the tops of the projection electrodes 5 are thus removed just before the mounting of the semiconductor component 1 on the circuit board 19, the surface of the projection electrodes 5 are kept clean until the mounting. Therefore, even when the semiconductor component 1 has projection electrodes 5 made of easily oxidized metal such as copper, reliable bonding can be realized.

The semiconductor component has been illustrated, however, an electronic component having a surface acoustic wave element on its surface and a lid body for protecting the surface acoustic wave element may be manufactured in the same method. This provides an advantage similar to the case of the semiconductor component.

What is claimed is:

1. An electronic component comprising:
   a substrate;
   a circuit element on said substrate;
   a connection electrode on said substrate, said connection electrode being coupled with said circuit element;
   a projection electrode on said connection electrode, said projection electrode projecting from a surface of said substrate; and
   a protective film for completely covering said circuit element, said substrate, and said projection electrode, wherein a first portion of said protective film covering said projection electrode projects from a second portion of said protective film covering said substrate.

2. An electronic component according to claim 1, further comprising a projection part formed on a top of said projection electrode, said projection part being more slender than a maximum diameter of said projection electrode.

3. An electronic component according to claim 2, wherein said protective film covers said projection part.

4. An electronic component according to claim 2, wherein at least a tip of said projection part is exposed from said protective film.

5. An electronic component according to claim 1, wherein said substrate is a semiconductor substrate, and said circuit element is a semiconductor device.

6. An electronic component according to claim 1, further comprising a lid body for covering said circuit element, wherein said protective film covers said substrate, said projection electrode, and said lid body.

7. An electronic component according to claim 6, wherein said substrate is a piezoelectric substrate, and said circuit element is a surface acoustic wave element.

8. An electronic component according to claim 1, wherein said protective film is a film selected from the group consisting of an oxide film, a nitride film, and a nitrogen oxide film.

9. An electronic component to claim 8, wherein a portion of said protective film of said projection electrode is thinner than any other said protective film.

10. An electronic component according to claim 1, wherein said protective film is one of a thermoset resin film, a thermoplastic resin film, and an ultraviolet curing resin film.

11. An electronic component according to claim 10, wherein a portion of said protective film on a top of said projection electrode is thinner than any other portion of said protective film.

12. A method of manufacturing an electronic component, comprising the steps of:

forming a circuit element and a connection electrode on a wafer;

forming a projection electrode on the connection electrode, the projection electrode projecting from a surface of the wafer;

forming a lid body for covering the circuit element;

covering the wafer and the lid body with a resin film, and completely covering the projection electrode with the resin film, a first portion of the resin film projecting from a second portion of the resin film covering the wafer; and curing the resin film.

13. A method according to claim 12, further comprising dividing the wafer after said step of curing the resin film.

14. A method according to claim 12, further comprising inclining a rotating axis of the wafer from a vertical direction to an arbitrary angle.

15. A method according to claim 12, wherein said completely covering the projection electrode comprises dropping resin onto the wafer and rotating the wafer.

16. A method according to claim 15, further comprising setting a temperature of the wafer to a curing temperature of the resin or lower before and after said dropping the resin.

17. A method according to claim 15, further comprising applying ultrasonic wave to the wafer before and after said dropping the resin.

18. A method according to claim 15, further comprising decompressing and degassing the resin after said dropping the resin onto the wafer.

19. An electronic component comprising:

a substrate;

a circuit element on said substrate;

a connection electrode on said substrate, said connection electrode being coupled with said circuit element;

a projection electrode on said connection electrode, said projection electrode projecting from a surface of said substrate;

a projection part located on a top of said projection electrode, said projection part being more slender than a maximum diameter of said projection electrode; and a protective film for covering said circuit element, said substrate, said projection electrode, and said projection part.

20. An electronic component comprising:

a substrate;

a circuit element on said substrate;

a connection electrode on said substrate, said connection electrode being coupled with said circuit element;

a projection electrode on said connection electrode, said projection electrode projecting from a surface of said substrate;

a projection part located on a top of said projection electrode, said projection part having a tip and being more slender than a maximum diameter of said projection electrode; and a protective film for covering said circuit element, said substrate, and said projection electrode, wherein at least said tip of said projection part is exposed from said protective film.

* * * * *